(12) United States Patent
Peterson et al.

(10) Patent No.: US 6,687,183 B2
(45) Date of Patent: *Feb. 3, 2004

(54) COMPILED VARIABLE INTERNAL SELF TIME MEMORY

(75) Inventors: Steven M. Peterson, Eagan, MN (US); Sifang Wu, Savage, MN (US); Mai Mac Lennan, Plymouth, MN (US); Carl A. Monzel, Lakeville, MN (US)

(73) Assignee: LSI Logic Corporation, Milpitas, CA (US)

(*) Notice: Subject to any disclaimer, the term of this patent is extended or adjusted under 35 U.S.C. 154(b) by 162 days.

This patent is subject to a terminal disclaimer.

(21) Appl. No.: 09/994,517

(22) Filed: Nov. 27, 2001

(65) Prior Publication Data

US 2003/0099128 A1 May 29, 2003

(51) Int. Cl.[7] .................................................. G11C 8/00
(52) U.S. Cl. ......................... 365/230.06; 365/189.05; 365/189.08
(58) Field of Search ............................. 365/51, 230.06, 365/189.05, 189.08, 191

(56) References Cited

U.S. PATENT DOCUMENTS

| 5,848,275 | A | * | 12/1998 | Maydan et al. ............. 717/159 |
| 5,960,202 | A | * | 9/1999 | Granston et al. ........... 717/141 |
| 5,974,485 | A | * | 10/1999 | Kruschinski ................ 710/52 |
| 6,069,836 | A | * | 5/2000 | Horne et al. ........... 365/230.06 |
| 6,434,074 | B1 | * | 8/2002 | Brown ........................ 365/210 |
| 6,483,754 | B1 | * | 11/2002 | Agrawal ................ 365/189.04 |
| 6,542,432 | B2 | * | 4/2003 | Sim ....................... 365/230.06 |

* cited by examiner

Primary Examiner—Van Thu Nguyen
Assistant Examiner—Hien Nguyen
(74) Attorney, Agent, or Firm—Suiter West PC LLO

(57) ABSTRACT

A method for changing the internal timing of a memory to allow adjustment of the access time of the memory to be faster or slower by increasing or decreasing internal margins of the memory (bit line separation), respectively, utilizes the memory compiler for setting the number of core cells used for driving a self time column of the memory.

23 Claims, 5 Drawing Sheets

COMPILED VARIABLE INTERNAL SELF TIME MEMORY

FIELD OF THE INVENTION

The present invention relates generally to self time memories, and more specifically, to methods for controlling the number of core cells placed in the self time column of a memory for controlling bit line separation in a memory during memory read access and the like.

BACKGROUND OF THE INVENTION

In self time memories, the circuitry used to control bit line separation has typically consisted of a single bank of core cells tied to a common self time word line. The self time bit line tracks to the memory array bit line by matching its capacitance and driving the self time bit line with multiple core cells such that the self time bit line separation or slew rate is a fixed multiple of the array bit line. The self time bit line drives into a simple inverter sense amp which then triggers the internal clock low and enables the memory array sense amps. The number of memory core cells used to drive the self time bit line can be adjusted to give a desired signal development (Vbl), as shown in FIG. 1. Thus, the bit line separation is an inverse function of the number of self time core cells connected to the self time word line (STWL), or "M-factor" of the memory. For instance, FIG. 2 illustrates a self time circuit 100 wherein the self time word line "STWL" 102 of the circuit 100 is connected to eight core cells 104. Thus, the circuit 100 illustrated would provide an M-factor of eight (8).

To modify the bit line separation, for example, to tune in a value of bit line separation that is sufficiently fast to accommodate the margin speed of the memory, the M-factor (i.e., number of core cells connected to the self-time word line) must be changed by either connecting or disconnecting core cells from the self time word line. Thus, as shown in FIG. 1, modification of the bit line separation by increasing the M-factor from eight (8) to nine (9) for the circuit 100 shown, requires that an additional core cell 106 be connected. Presently, memories are provided with a fixed core cell multiple based on simulated results during memory development. However, connection or disconnection of core cells requires multiple mask changes making failure analysis or experimentation difficult and costly.

Consequently, it is desirable to more readily change the internal timing of a memory to allow adjustment of the access time of the memory to be faster or slower by respectively increasing or decreasing internal margins of the memory (bit line separation).

SUMMARY OF THE INVENTION

Accordingly, the present invention changes the internal timing of a memory by means of a compiler code to allow adjustment of the access time of the memory to be faster or slower by increasing or decreasing internal margins of the memory (bit line separation), respectively.

In accordance with one aspect of the invention, a method is provided for controlling bit line separation of the memory by controlling the number of core cells used for driving a self time column of the memory. In one embodiment, the method includes the steps of selecting a variable within a compiler compiling the memory for varying the number of core cells used for driving the self time column of the memory, and tiling core cells of the memory according to the received variable during compilation of the memory so as to configure the self time column to have a number of core cells suitable for providing a desired self time bit line separation. In embodiments of the invention, the variable is hard coded within the compiler or entered into the compiler by a user.

In a second aspect of the invention, a self time circuit for a memory is provided. In exemplary embodiments, the self time circuit comprises a plurality of core cells within the memory and a plurality of self time word lines, each of the self time lines being coupled to at least one core cell for activating the core cell. In accordance with the present invention, the number of core cells coupled to at least one of the self time word lines is set during compilation by a compiler by adjusting a variable of the compiler for controlling bit line separation of the memory when the memory is accessed.

It is to be understood that both the foregoing general description and the following detailed description are exemplary and explanatory only and are not restrictive of the invention as claimed. The accompanying drawings, which are incorporated in and constitute a part of the specification, illustrate presently preferred embodiments of the invention, and together with the general description given above and the detailed description of the preferred embodiments given below, serve to explain the principles of the invention.

BRIEF DESCRIPTION OF THE DRAWINGS

The detailed description of the invention may be best understood when read in reference to the accompanying drawings wherein.

DETAILED DESCRIPTION OF THE INVENTION

The present invention provides a system and method for controlling the number of core cells used for driving a self time column in a self time memory, thereby allowing the amount of bit line separation that is developed during a memory access to be varied. Reference will now be made in detail to the presently preferred embodiment of the invention, an example of which is illustrated in the accompanying drawings.

Figure 3:
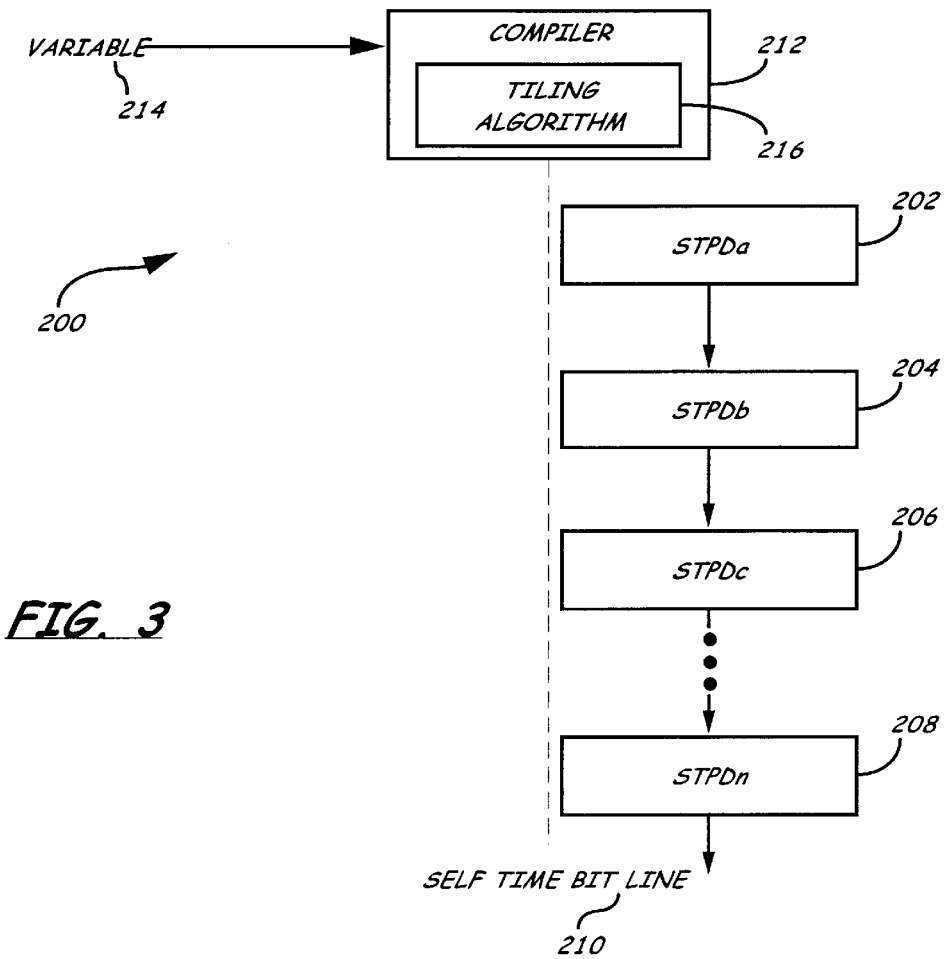
FIG. 3 is a block diagram illustrating changing of the internal timing of a memory by means of a compiler to allow adjustment of the access time of the memory to be faster or slower by increasing or decreasing internal margins of the memory (bit line separation), respectively.
Figure 2:
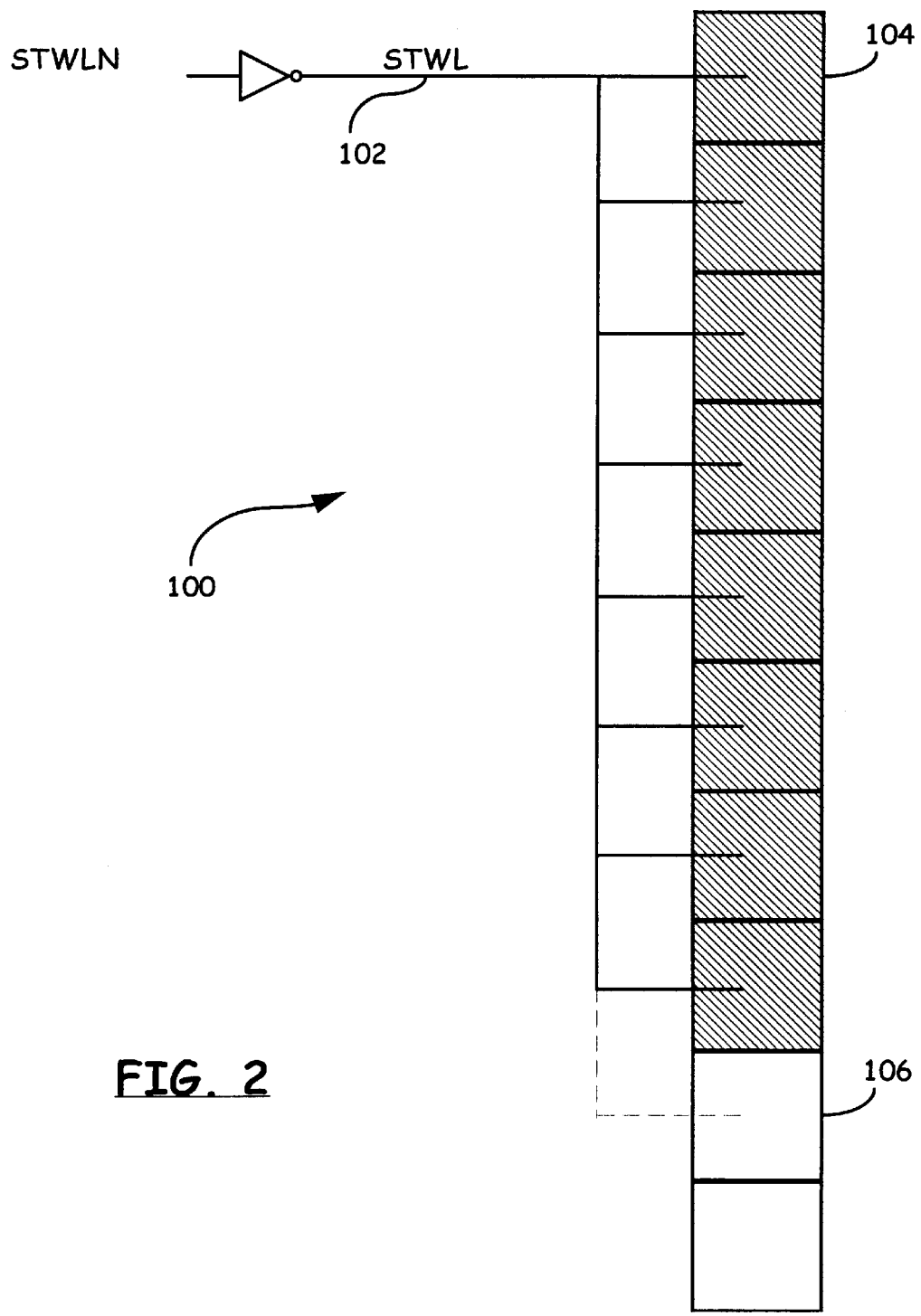
FIG. 2 is a block diagram illustrating a self time column providing bit line separation in a memory.

Referring now to FIG. 3, a method in accordance with an exemplary embodiment of the present invention for controlling bit line separation of a self time memory by controlling the number of core cells used for driving a self time column of the memory is described. As shown in FIG. 3, the self time column 200 of a self time memory may include one or more self time pull down cells each comprised of one or more memory core cells. For instance in the exemplary embodiment shown, self time column includes n self time pull down cells ("STPDa" 202, "STPDb" 204, STPDc" 206 up to STPDn 208) for controlling the separation of slew rate of the self time bit line 210. The self time bit line 210 drives into a simple inverter sense amp which then triggers the internal clock low and enables the memory array sense amps.

Figure 1:
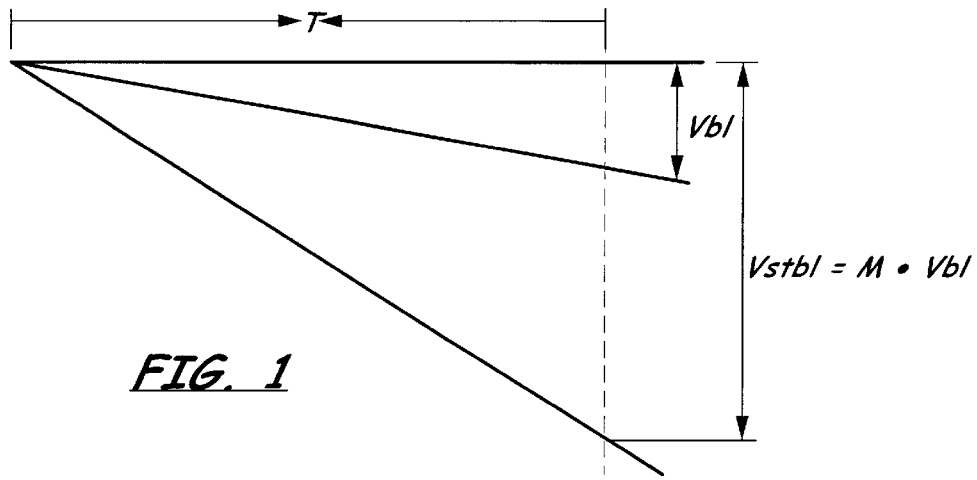
FIG. 1 is a schematic diagram illustrating signal development (Vbl) of the self time bit line of an exemplary memory illustrating "M" factor.

The number of memory core cells used to drive the self time bit line 210 is adjusted by compiler 212 when the memory is compiled to provide a desired bit line separation (Vstbl) (FIG. 1). The bit line separation is an inverse function of the number of self time core cells connected in the bit line 210, or "M-factor" of the memory according to the formula $$Vstbl = M \cdot Vbl \qquad \text{Equation 1}$$

where Vstbl is the bitline voltage of the self time column, Vbl is the bitline voltage of the memory array columns, and M is the number of core cells in the self time column or "M" factor. As shown in FIG. 3, a variable 214 is selected for varying the number of core cells (M) used for driving the self time column 200 of the memory. In exemplary embodiments, this variable 214 may be input into compiler 212 by a user, or alternately, hard-coded in the compiler 212 based on simulation, past experience, testing, or the like. A tiling algorithm 216 of compiler 212 then tiles or places core cells of the memory according to the variable 214 during compilation of the memory. Thus, depending on the selection of variable 214, self time column 200 may be provided with up to n self time pull down cells (STPDs) each comprised of one or more core cells. In this manner, the present invention allows configuration of the self time column to have a number of core cells suitable for providing a desired self time bit line separation. Thus, the internal timing of the memory may be adjusted by the compiler 212 by increasing or decreasing internal margins of the memory (bit line separation) so that the access time of the memory is faster or slower.

In one embodiment, variable 214 may correspond to the number of core cells of self time column 200 or M (Equation 1). Alternately, variable 214 may comprise a set of values, a matrix of values, a complex value, or the like suitable for describing the number of self time pull down cells 202–208 of self time column 200 and the number core cells to be placed in each self time pull down cell 202–208.

Figure 4:
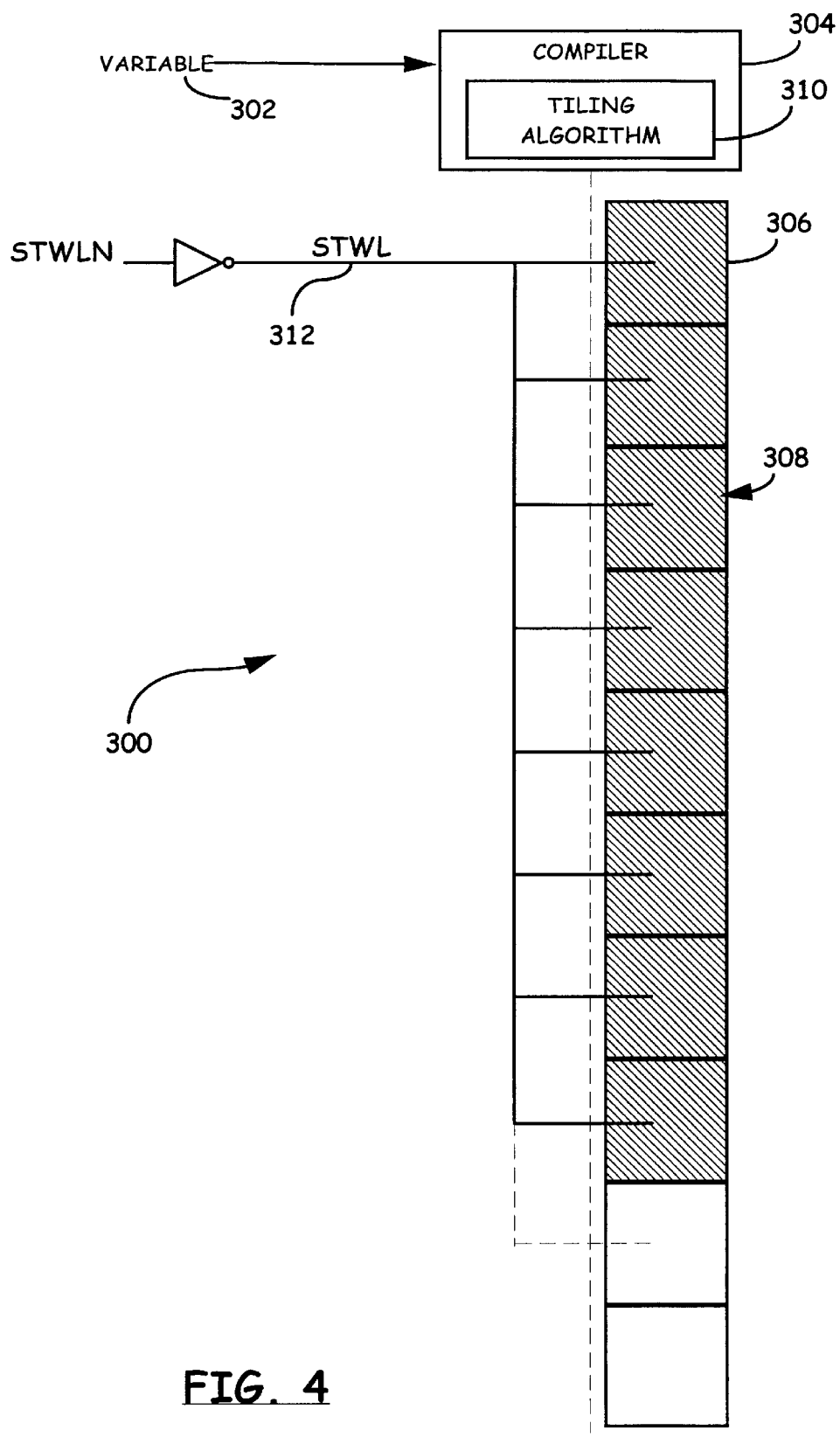
FIG. 4 is a block diagram illustrating a compilable self time column in accordance with an exemplary embodiment of the present invention.

FIG. 4 illustrates a compilable self time circuit 300 in accordance with an exemplary embodiment of the present invention. A suitable variable 302 is selected and provided to compiler 304 for controlling the number of core cells 306 used for driving the self time column 308 of the memory to achieve a desired bit line separation. Variable 302 may be input into compiler 304 by a user, or alternately, hard-coded in the compiler 304 based on simulation, past experience, testing, or the like. A tiling algorithm 310 of compiler 304 then tiles or places a number of core cells 306 of the memory according to variable 302 during compilation of the memory by connecting the core cells 306 to self time word line (STWL) 312, which is, in turn, used to drive the core cells 306 when the memory is accessed. FIG. 4 illustrates an exemplary compilable self time circuit 300 wherein a variable 302 is selected that will cause the tiling algorithm 310 to connect the self time word line "STWL" 310 to eight core cells 306 (e.g., the numeral eight "8"). Thus, the circuit 300 illustrated would provide an M-factor (M) of eight (8). However, the bit line separation may be varied by selecting another variable. The tiling algorithm 310 will then connect a different number of core cells 306. For example, as shown in FIG. 4, variable 302 may be given the value of nine (9), in which case nine core cells 306 are connected to the self time word line "STWL" 310, providing an M-factor of nine (9).

Figure 5:
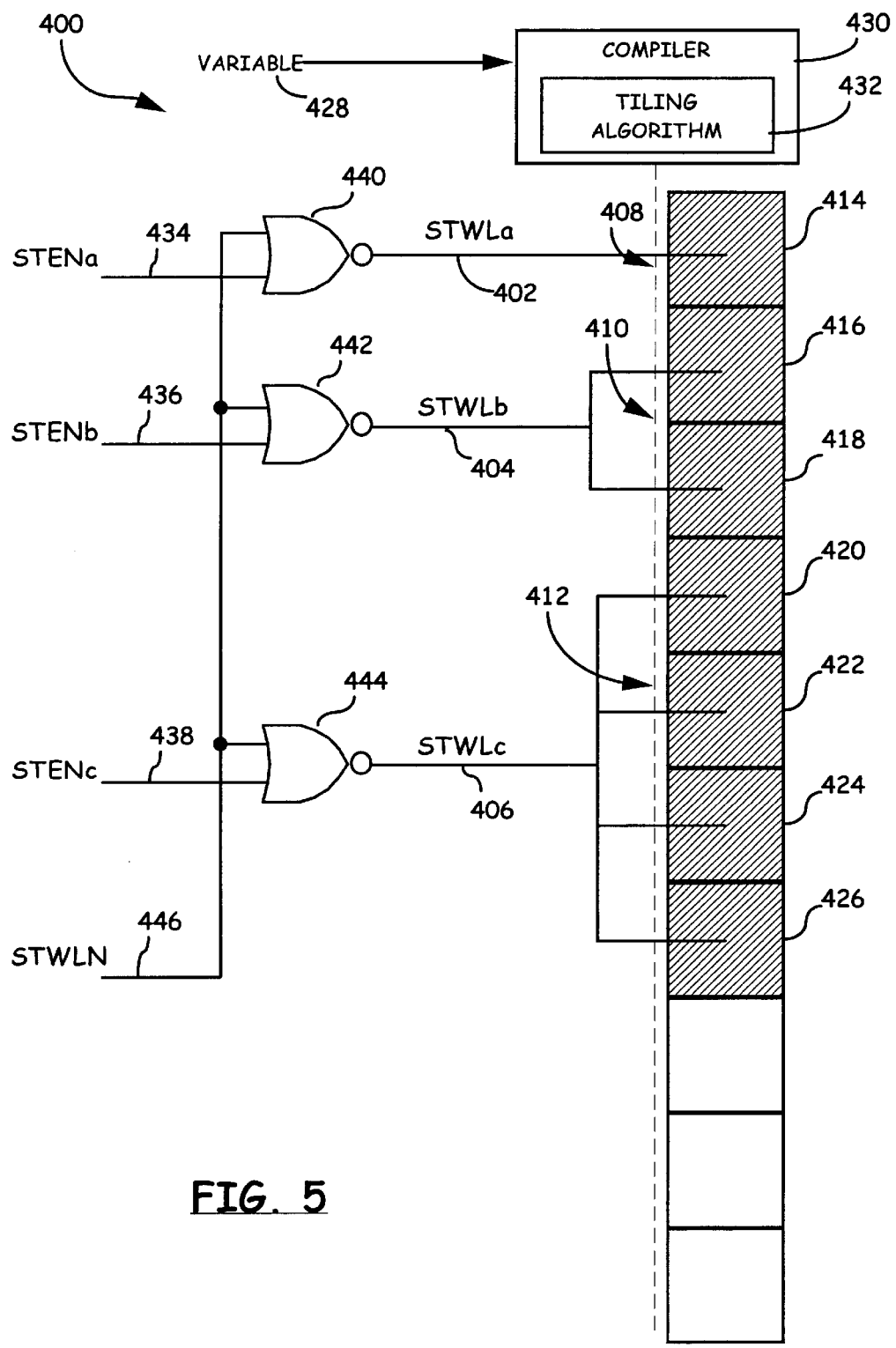
FIG. 5 is a block diagram illustrating a compilable, programmable self time column in accordance with an exemplary embodiment of the present invention.

FIG. 5 illustrates a compilable, programmable self time circuit suitable for use in controlling bit line separation in a memory in accordance with an exemplary embodiment of the present invention. The self time circuit 400 includes multiple self time word lines 402–406 each connected to a self time pull down cell (STPD) 408–412 each comprised of varying number of core cells 414–426 of the memory.

In the exemplary embodiment shown, a suitable variable 428 is selected and provided to compiler 430 for controlling the number of core cells 414–426 connected to each self time word line 402–406 to achieve a desired bit line separation. Preferably, variable 428 may comprise a set of values, a matrix of values, a complex value, or the like suitable for describing the number of self time pull down cells (STPDs) 408–412 and the number core cells 414–426 to be placed in each self time pull down cell (STPD) 408–412. Variable 302 may be input into compiler 304 by a user, or alternately, hard-coded in the compiler 304 based on simulation, past experience, testing, or the like. A tiling algorithm 432 of compiler 430 tiles or places a number of core cells 414–426 of the memory according to variable 428 during compilation of the memory by connecting the core cells 414–426 to self time word lines 402–406, which are, in turn, used to drive the core cells 306 when the memory is accessed.

In the embodiment shown, three self time word lines "STWLa" 402, "STWLb" 404, and "STWLc" 406 are provided. After compilation, self time word line "STWLa" 402 is connected to a single core cell 414, while self time word line "STWLb" 404 is connected to two core cells 416 & 418, and self time word line "STWLc" 408 is connected to four core cells 420, 422, 424 & 426, respectively. Self time word lines "STWLa" 402, "STWLb" 404, and "STWLc" 406 receive enable signals that may either be programmed on/off, or externally controlled to specific states. For instance, as shown in FIG. 5, self time circuit 400 may further include a plurality of self time enable lines "STENa" 434, "STENb" 436, and "STENc" 438, each providing one input of a NOR gate or like logic device 440, 442 & 444, for which the other input is the normal common self time word line "STWLN" 446 of the memory and the output is a self time word line "STWLa" 402, "STWLb" 404, or "STWLc" 406, respectively. Thus, NOR gate 440 has inputs of self time enable line "STENa" 434 and common self word line "STWLN" 446 and an output of self time word line "STWLa" 402, NOR gate 442 has inputs of self time enable line "STENb" 436 and common self word line "STWLN" 446 and an output of self time word line "STWLb" 404, and NOR gate 444 has inputs of self time enable line "STENc" 438 and common self word line "STWLN" 446 and an output of self time word line "STWLc" 406.

The self time enable signals of self time enable lines "STENa" 434, "STENb" 436, and "STENc" 438 may be either programmed or externally set to specific states before the memory is accessed. In this manner, when the memory is accessed, the signal that would normally activate the common self time word line, provided via self time word line "STWLN" 446, is input to NOR gates 440, 442 & 444 along with the preset or preprogrammed states provided by self time enable lines "STENa" 434, "STENb" 436, and "STENc" 438. Depending on the state of the self time enable signals of self time enable lines "STENa" 434, "STENb" 436, and "STENc" 438, self time word lines "STWLa" 402, "STWLb" 404, or "STWLc" 406 will either be asserted or not asserted. The combination of self time word lines "STWLa" 402, "STWLb"404, or "STWLc" 406 that are asserted will activate a number of core cells 414–426 (referred to as the M-factor) which will in turn allow for a certain amount of bit line separation. It will be appreciated that the number of possible bit line separations is limited only by the number of self time word lines, self time enable lines and core cells connected to each self time word line during compilation.

Figure 6:
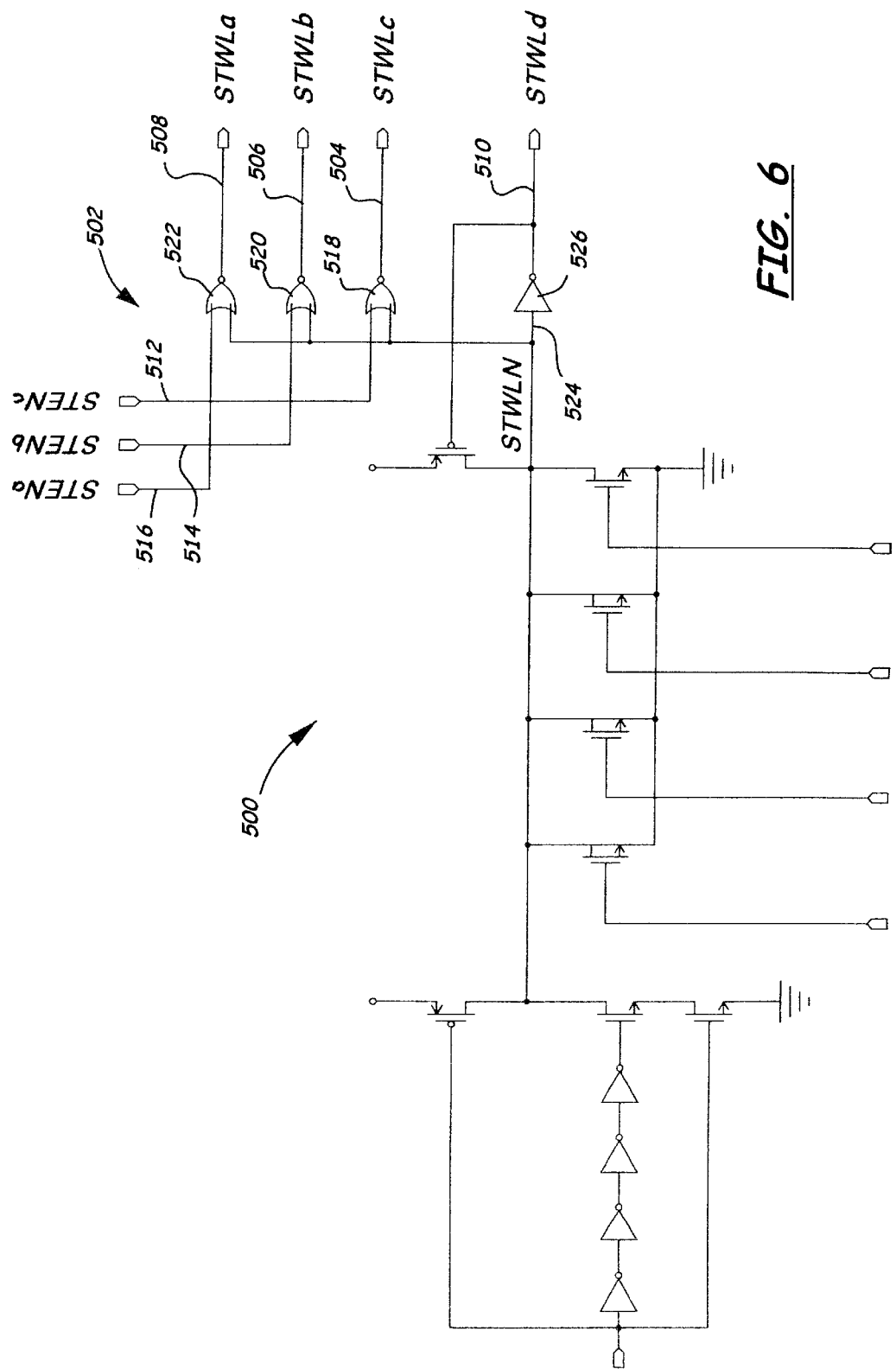
FIG. 6 is a block diagram illustrating a self time circuit suitable for use in controlling bit line separation in a memory in accordance with an exemplary embodiment of the present invention.

Referring now to FIG. 6, an exemplary implementation of a compilable, programmable self time circuit in a memory is described. The memory 500 shown includes a self time circuit 502 having four self time word lines labeled "STWLa" 504, "STWLb" 506, "STWLc" 508 and "STWLd" 510. When compiled in accordance with the present invention, self time word lines"STWLa" 504, "STWLb" 506, "STWLc" 508 and "STWLd" 510 are each connected to a self time pull down circuit comprising one or more core cells of the memory 500. Self time word lines "STWLa" 504, "STWLb" 506, "STWLc" 508 and "STWLd" 510 receive enable signals that may either be programmed on/off, or externally controlled to specific states. As shown in FIG. 6, self time word lines "STWLa" 504, "STWLb" 506, and "STWLc" 508 receive enable signals via self time enable lines "STENa" 512, "STENb" 514, and "STENc" 516. These self time enable lines each provide one input of a respective one of NOR gates 518, 520 & 522, for which the other input is the normal common self time word line "STWLN" 524 and the outputs are self time word lines "STWLa" 504, "STWLb" 506, and "STWLc" 508, respectively. Self time word line "STWLd" 510 receives an enable signal via "STWLN" 524 inverted by inverter 526.

The self time enable signals of self time enable lines "STENa" 512, "STENb" 514, and "STENc" 516, may be either programmed or externally set to specific states before the memory 500 is accessed. In this manner, when memory 500 is accessed, the signal that would normally activate the common self time word line, provided via self time word line "STWLN" 524, is input to NOR gates 518, 520 & 522 along with the preset or preprogrammed states provided by self time enable lines "STENa" 512, "STENb" 514, and "STENC" 516. The signal provided by self time word line "STWLN" 524 is also input to inverter 526. Depending on the state of the self time enable signals of self time enable lines "STENa" 512, "STENb" 514, and "STENC" 516, self time word lines "STWLa" 504, "STWLb" 506, and "STWLc" 508 will either be asserted or not asserted. The combination of self time word lines "STWLa◦ 504, "STWLb" 506, "STWLc" 508 and "STWLd" 510 that are asserted will activate the desired number of core cells providing the M-factor for the amount of bit line separation desired. M-factors for combinations of self time enable lines "STENa" 512, "STENb" 514, and "STENC" 516 states where self time word line "STWLa" 504 is connected to two core cells, self time word line "STWLb" 506 is connected to two core cells, self time word line "STWLc" 508 is connected to 4 core cells, and self time word line "STWLd" 510 is connected to six core cells are provided in TABLE 1 by way of example.

TABLE 1

| STENc | STENb | STENa | M-factor |
|-------|-------|-------|----------|
| 0 | 0 | 0 | 13 |
| 0 | 0 | 1 | 12 |
| 0 | 1 | 0 | 11 |
| 0 | 1 | 1 | 10 |
| 1 | 0 | 0 | 9 |
| 1 | 0 | 1 | 8 |
| 1 | 1 | 0 | 7 |
| 1 | 1 | 1 | 6 |

The compilable self time memory of the present invention allows a manufacturer to change the internal timing of a memory by means of compiler code to allow adjustment of the memory access time to be faster or slower by respectively reducing or increasing internal margins (bit line separation). In embodiments, the present invention may be utilized as a development analysis tool to analyze the amount of internal margins required before a particular memory will fail. The present invention may also be used to improve internal timing of memories as the manufacturing process matures, or may be provided as a user option to alternately provide improved speed by reducing margins, thereby increasing the risk of memory failure, or to reduce the risk of memory failure where high access speed is not required.

The compilable self time memory of present invention, when programmable, also allows for modification of the bit line separation through multiple methods such as a FIB (Focused Ion Beam) change, a single mask change, or through external signals. Further, the memory can be built with a varying number of self time word lines/enables to allow for more or less variability of the bit line separation. In this manner, the present invention allows for experimentation with the bit line separation required for sensing which is a parameter that is impossible to determine without empirical silicon test data. Since the speed of the memory is directly related to the amount of bit line separation, knowledge of the bit line separation parameter will allow faster memories to be fabricated. The ability to modify the bit line separation is also useful in failure analysis because inadequate bit line separation can be a cause of functional failure of the memory.

It is believed that the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A method for controlling bit line separation of a memory when the memory is accessed by controlling the number of core cells used for driving a self time column of the memory, comprising:

selecting a variable within a compiler compiling the memory for varying the number of core cells used for driving the self time column of the memory; and tiling core cells of the memory according to the received variable during compilation of the memory so as to configure the self time column to have a number of core cells suitable for providing a desired self time bit line separation.

2. The method as claimed in claim 1, wherein the variable is hard coded within the compiler.

3. The method as claimed in claim 1, wherein the variable is entered into the compiler by a user for compilation of the memory.

4. A self time circuit for a memory, comprising:

a plurality of core cells within the memory; and a self time word line coupled to at least one core cell for activating the core cell;

wherein the number of core cells coupled to the self time word line is set during compilation by a compiler by adjusting a variable of the compiler for controlling bit line separation of the memory when the memory is accessed.

5. The self time circuit as claimed in claim 4, wherein the variable is hard coded within the compiler.

6. The self time circuit as claimed in claim 4, wherein the variable is entered into the compiler by a user for compilation of the memory.

7. A self time circuit for a memory, comprising:

a plurality of core cells within the memory; and a plurality of self time word lines, each of the self time lines being coupled to at least one core cell for activating the core cell;

wherein the number of core cells coupled to at least one of the self time word lines is set during compilation by a compiler by adjusting a variable of the compiler for controlling bit line separation of the memory when the memory is accessed.

8. The self time circuit as claimed in claim 7, wherein the variable is hard coded within the compiler.

9. The self time circuit as claimed in claim 7, wherein the variable is entered into the compiler by a user for compilation of the memory.

10. The self time circuit as claimed in claim 7, further comprising a plurality of self time enable lines, each self time enable line being coupled to a logic gate with a common self time word line, the output of the logic gate being a self time word line.

11. The self time circuit as claimed in claim 10, wherein at least one of the logic gates comprises a NOR gate.

12. The self time circuit as claimed in claim 10, wherein the self time enable lines are set to a desired state prior to the memory being accessed.

13. A memory, comprising:

a plurality of core cells;

a plurality of self time word lines, each of the self time lines being coupled to at least one core cell for activating the core cell;

a plurality of self time enable lines, each self time enable line being coupled to a common self time word line by a logic gate, the output of the logic gate being a self time word line, wherein the number of core cells coupled to at least one of the self time word lines is set during compilation by a compiler by adjusting a variable of the compiler for controlling bit line separation of the memory when the memory is accessed.

14. The memory as claimed in claim 13, wherein the variable is hard coded within the compiler.

15. The memory as claimed in claim 13, wherein the variable is entered into the compiler by a user for compilation of the memory.

16. The memory as claimed in claim 13, wherein at least one of the logic gates comprises a NOR gate.

17. The memory as claimed in claim 13, wherein the self time enable lines are set to a desired state prior to the memory being accessed.

18. The memory as claimed in claim 13, comprising a first self time word line coupled to at least a first core cell, a second self time word line coupled to at least a second core cell, and a third self time word line coupled to at least a third core cell.

19. The memory as claimed in claim 18, further comprising a first self time enable line, a second self time enable line, a third self time enable line, the first, second and third self time enable lines being coupled to a logic gate with a common self time word line, the output of each logic gate being one of the first, second, and third self time word lines respectively.

20. A self time circuit for a memory, comprising:

a plurality of core cells within the memory; and means, coupled to the core cells, for activating the core cells;

wherein the number of core cells coupled to the activating means is set during compilation by a compiler by adjusting a variable of the compiler for controlling bit line separation of the memory when the memory is accessed.

21. The self time circuit as claimed in claim 20, wherein the activating means are set to a desired state prior to the memory being accessed.

22. The self time circuit as claimed in claim 20, wherein the variable is hard coded within the compiler.

23. The self time circuit as claimed in claim 20, wherein the variable is entered into the compiler by a user for compilation of the memory.

* * * * *